United States Patent
Caffee et al.

(10) Patent No.: US 10,008,981 B2
(45) Date of Patent: Jun. 26, 2018

(54) INTEGRATED CLOCK GENERATOR AND METHOD THEREFOR

(71) Applicant: Silicon Laboratories Inc., Austin, TX (US)

(72) Inventors: Aaron J. Caffee, Scappoose, OR (US); Brian G. Drost, Corvallis, OR (US); Hendricus de Ruijter, Sunnyvale, CA (US)

(73) Assignee: Silicon Laboratories Inc., Austin, TX (US)

( * ) Notice: Subject to any disclaimer, the term of this patent is extended or adjusted under 35 U.S.C. 154(b) by 190 days.

(21) Appl. No.: 15/096,612

(22) Filed: Apr. 12, 2016

(65) Prior Publication Data

US 2016/0226443 A1  Aug. 4, 2016

Related U.S. Application Data

(63) Continuation-in-part of application No. 14/339,113, filed on Jul. 23, 2014, now Pat. No. 9,356,606.

(51) Int. Cl.
*H03B 5/08* (2006.01)
*H03B 5/12* (2006.01)
(Continued)

(52) U.S. Cl.
CPC ............. *H03B 5/1234* (2013.01); *H03B 5/12* (2013.01); *H03B 5/1265* (2013.01); *H03B 5/36* (2013.01);
(Continued)

(58) Field of Classification Search
CPC . H03L 7/02; H03L 7/183; H03L 1/026; H03L 11/00; H03B 5/12; H03B 5/1234; H03B 5/1265
(Continued)

(56) References Cited

U.S. PATENT DOCUMENTS

| 6,798,299 B1 | 9/2004 | Mar et al. |
| 7,332,975 B2 | 2/2008 | Marques |

(Continued)

OTHER PUBLICATIONS

Chun-Ming Hsu, et al., "A Low-Noise Wide-BW 3.6-GHz Digital ΔΣ Fractional-N Frequency Synthesizer With a Noise-Shaping Time-to-Digital Converter and Quantization Noise Cancellation," IEEE Journal of Solid-State Circuits, vol. 43, No. 12, Dec. 2008, pp. 2776-2786.

(Continued)

*Primary Examiner* — Arnold Kinkead
(74) *Attorney, Agent, or Firm* — Polansky & Associates, P.L.L.C.; Paul J. Polansky

(57) ABSTRACT

An integrated clock generator includes a tunable LC oscillator, a tunable frequency synthesizer, and a processor. The tunable LC oscillator has an input for receiving an oscillator control signal, and an output for providing an oscillator clock signal. The tunable frequency synthesizer has a clock input coupled to the output of the tunable LC oscillator, a control input for receiving a synthesizer control signal, and an output for providing a clock output signal. The processor has an input for receiving a data input signal, a first output for providing the oscillator control signal, and a second output for providing the synthesizer control signal. The processor provides the oscillator control signal and the synthesizer control signal such that the tunable frequency synthesizer generates the output clock signal at a frequency indicated by the data input signal, and provides the synthesizer control signal further in response to a dynamic condition.

28 Claims, 9 Drawing Sheets

(51) Int. Cl.
*H03L 1/00* (2006.01)
*H03B 5/36* (2006.01)
*H03L 1/02* (2006.01)
*H03L 7/02* (2006.01)
*H03L 7/087* (2006.01)
*H03L 7/095* (2006.01)
*H03L 7/22* (2006.01)
*H03L 7/23* (2006.01)
*H03L 7/183* (2006.01)
*H03L 7/197* (2006.01)

(52) U.S. Cl.
CPC ............. *H03L 1/00* (2013.01); *H03L 1/026* (2013.01); *H03L 7/02* (2013.01); *H03L 7/087* (2013.01); *H03L 7/095* (2013.01); *H03L 7/22* (2013.01); *H03L 7/23* (2013.01); *H03L 7/183* (2013.01); *H03L 7/1976* (2013.01)

(58) Field of Classification Search
USPC .......... 331/1 R, 18, 167, 117 FE, 117 R, 176
See application file for complete search history.

(56) References Cited

U.S. PATENT DOCUMENTS

| | | | |
|---|---|---|---|
| 7,525,392 B2* | 4/2009 | Tarng | H03B 5/04 331/16 |
| 7,671,688 B2 | 3/2010 | Marques | |
| 7,777,585 B1 | 8/2010 | Sonntag | |
| 8,049,569 B1 | 11/2011 | Wright et al. | |
| 8,248,280 B2 | 8/2012 | Zhan et al. | |
| 8,315,587 B2 | 11/2012 | Tadayon et al. | |
| 2002/0011902 A1* | 1/2002 | Ipek | H03L 7/087 331/17 |
| 2011/0076972 A1 | 3/2011 | Cooley | |
| 2011/0159835 A1 | 6/2011 | Xuan et al. | |
| 2011/0187462 A1 | 8/2011 | Sonntag | |
| 2012/0043999 A1 | 2/2012 | Quevy et al. | |
| 2013/0010909 A1 | 1/2013 | Huang et al. | |
| 2014/0055179 A1 | 2/2014 | Gong et al. | |
| 2015/0180486 A1* | 6/2015 | Shanan | H03L 7/099 327/156 |

OTHER PUBLICATIONS

Silicon Laboratories, Inc., "Crystal-Less SoC RF Transmitter," Product Specification, Si4010-C2, Rev. 1.0, Feb. 2011, 156 pages.

M. S. McCorquodale et al., "A Monolithic and Self-Referenced RF LC Clock Generator Compliant with USB 2.0," IEEE Journal of Solid-State Circuits, vol. 42, No. 2, pp. 385-399, Feb. 2007.

A. Ahmed et al., "A Highly Stable CMOS Self-Compensated Oscillator (SCO) Based on an LC Tank Temperature Null Concept," Joint Conference of the IEEE International Frequency Control and the European Frequency and Time Forum, pp. 1-5, May 2011.

* cited by examiner

INTEGRATED CLOCK GENERATOR AND METHOD THEREFOR

This application is a continuation-in-part of application Ser. No. 14/339,113, filed Jul. 23, 2014, entitled "Clock Generator using Free-Running Oscillator and Method Therefore," invented by the inventors hereof and assigned to the assignee hereof, the contents of which are incorporated herein in their entirety.

FIELD OF THE DISCLOSURE

The present disclosure relates generally to clock circuits, and more particularly to crystal-less clock generators.

BACKGROUND

Clock generators are used in a variety of integrated circuits. For example, receiver chips use clock generators for local oscillator signals to mix a radio frequency (RF) signal to an intermediate frequency (IF) or to baseband. Transmitter chips use clock generators to generate carrier waves for RF signal transmission. Since these integrated circuits can tolerate very little frequency error, they typically use external crystals to generate precise mixing or carrier clock signals.

However crystal-based oscillators have drawbacks. For example, crystals are electromechanical devices that are trimmed to resonate at a particular frequency, and they are not compatible with modern CMOS integrated circuit manufacturing technologies. Thus the use of discrete crystals for crystal oscillators increases printed circuit board area and cost due to the added cost of the crystals. In addition, the connections between the integrated circuit and the external crystal pick up electromagnetic signal energy, causing phase jitter. Moreover there are some circumstances in which the frequency of a crystal oscillator will deviate significantly from its rated frequency. For example, as a printed circuit board heats and cools, the solder compound may not expand and contract at the same rate as the printed circuit board substrate. The result is that heating and cooling exerts mechanical stresses on the integrated circuit pins used to connect to the crystal. This condition, known as solder shift, causes the capacitance on the terminals of the crystal to change, which causes the oscillation frequency to shift due to the change in capacitance, but in generally unpredictable ways.

BRIEF DESCRIPTION OF THE DRAWINGS

The present disclosure may be better understood, and its numerous features and advantages made apparent to those skilled in the art by referencing the accompanying drawings, in which.

Figure 1:
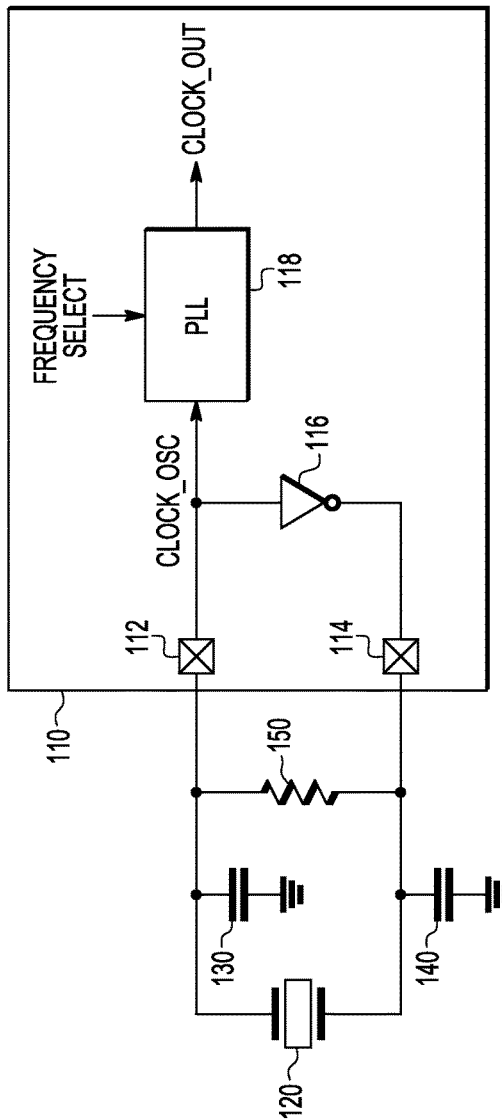
FIG. 1 illustrates in partial block diagram and partial schematic form a clock generator known in the prior art.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, an integrated clock generator includes a tunable LC oscillator, a tunable frequency synthesizer, and a processor. The tunable LC oscillator has an input for receiving an oscillator control signal, and an output for providing an oscillator clock signal. The tunable frequency synthesizer has a clock input coupled to the output of the tunable LC oscillator, a control input for receiving a synthesizer control signal, and an output for providing a clock output signal. The processor has an input for receiving a data input signal, a first output for providing the oscillator control signal, and a second output for providing the synthesizer control signal. The processor provides the oscillator control signal and the synthesizer control signal such that the tunable frequency synthesizer generates the output clock signal at a frequency indicated by the data input signal, and provides the synthesizer control signal further in response to a dynamic condition.

In another form, an integrated circuit comprises a tunable LC oscillator, a tunable frequency synthesizer, a processor, and a functional circuit. The tunable LC oscillator has an input for receiving an oscillator control signal, and an output for providing an oscillator clock signal. The tunable frequency synthesizer has a clock input coupled to the output of the tunable LC oscillator, a control input for receiving a synthesizer control signal, and an output for providing a clock output signal. The processor has an input for receiving a data input signal, a first output for providing the oscillator control signal, and a second output for providing the synthesizer control signal. The processor provides the oscillator control signal and the synthesizer control signal such that the tunable frequency synthesizer generates the output clock signal at a frequency indicated by the data input signal, and provides the synthesizer control signal further in response to a dynamic condition. The functional circuit has an input for receiving the clock output signal, and is a circuit that uses the clock output signal to operate. Examples of functional circuits include RF signal mixers, power amplifiers, microprocessor cores, timers, and the like.

In yet another form, a method includes setting a frequency of a tunable LC oscillator in response to an oscillator control signal. An oscillator clock signal is provided as an output of the tunable LC oscillator. A clock output signal is synthesized, for example in a PLL frequency synthesizer, in response to the oscillator clock signal and a synthesizer control signal. The oscillator control signal and the synthesizer control signals are formed in response to a data input signal. The synthesizer control signal is formed further in response to a dynamic condition.

FIG. 1 illustrates in partial block diagram and partial schematic form a clock generator 100 known in the prior art. Clock generator 100 is implemented using both components on an integrated circuit 110 as well as components external to integrated circuit 110. Clock generator 100 includes generally two integrated circuit terminals 112 and 114 associated with clock generator 100, an inverter 116, and a phase locked loop (PLL) 118 on integrated circuit 110, and a crystal 120, capacitors 130 and 140, and a resistor 150 external to integrated circuit 110. Inverter 116 has an input connected to integrated circuit terminal 112 for receiving an oscillator clock signal labeled "CLOCK_OSC", and an output connected to integrated circuit terminal 114. PLL 118 has a reference clock input connected to integrated circuit terminal 112, a control input for receiving a control signal labeled "FREQUENCY SELECT", and an output for providing a signal labeled "CLOCK_OUT". Crystal 120 has a first terminal connected to integrated circuit terminal 112, and a second terminal connected to integrated circuit terminal 114. Capacitor 130 has a first terminal connected to integrated circuit terminal 112, and a second terminal connected to ground. Capacitor 140 has a first terminal connected to integrated circuit terminal 114, and a second terminal connected to ground. Resistor 150 has a first terminal connected to integrated circuit terminal 112, and a second terminal connected to integrated circuit terminal 114.

Clock generator 100 is based on a crystal oscillator formed using crystal 120 to provide a stable CLOCK_OSC signal that can be used as an accurate internal clock source. Crystal 120 is trimmed to provide a very accurate frequency reference that is accurate to within, for example, 10-20 parts per million (ppm). Inverter 116, in conjunction with capacitors 130 and 140, provides positive loop gain and causes oscillation at a frequency determined by the physical characteristics of crystal 120. Resistor 150 is connected in parallel to crystal 120 and inverter 116 and is used to keep inverter 116 properly biased.

PLL 118 receives the CLOCK_OSC signal and multiplies it by an appropriate factor determined by the FREQUENCY SELECT signal to provide the CLOCK_OUT signal at a desired frequency. For example, crystal 120 could be trimmed to 25 megahertz (MHz), while PLL 118 provides CLOCK_OUT in the range of from 700 MHz to 2.6 Gigahertz range for transmitting a cellular telephone signal according to the North American 4G LTE standard, thus multiplying the CLOCK_OSC signal by factors between 28 and 104.

While clock generator 100 has proven to be a popular and durable architecture over many years, it has some disadvantages. First, it requires the added expense of an external crystal, including both the crystal itself and the printed circuit board space. Second, it can lose its very accurate frequency reference as the crystal ages under certain circumstances. As the printed circuit board temperature varies, the solder contacts between the terminals of crystal 120 and the printed circuit board can become stressed, leading to a change in parasitic capacitance and loss of the precise frequency reference, a condition known as "solder shift". Other electromechanical reference elements, such as microelectromechanical systems (MEMS) resonators and surface acoustic wave (SAW) resonators, have similarly accurate frequency references but are likewise expensive and add to product cost, as well as being susceptible to the solder shift problem.

Figure 2:
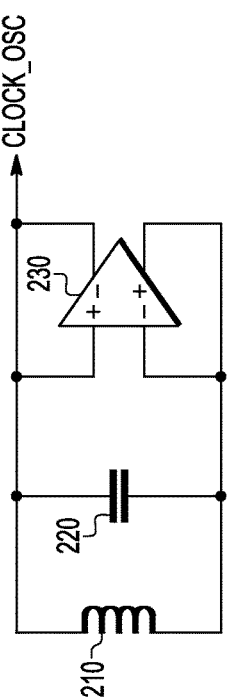
FIG. 2 illustrates in partial block diagram and partial schematic form an oscillator known in the prior art.

FIG. 2 illustrates in partial block diagram and partial schematic form an oscillator 200 known in the prior art. Oscillator 200 includes generally an inductor 210, a capacitor 220, and a transconductance amplifier 230. Inductor 210 has first and second terminals. Capacitor 220 has first and second terminals respectively connected to the first and second terminals of inductor 210. Transconductance amplifier 230 has a non-inverting input connected to the first terminals of inductor 210 and capacitor 220, an inverting input connected to the second terminals of inductor 210 and capacitor 220, an inverting output terminal connected to the non-inverting input thereof and providing the CLOCK_OSC signal, and a non-inverting output connected to the inverting input thereof.

Oscillator 200 avoids the use of a crystal reference, eliminating the added crystal and printed circuit board cost. Moreover oscillator 200 can be implemented completely on-chip to reduce cost. However oscillator 200 is not as accurate as the crystal-based oscillator of FIG. 1. Its resonant frequency is determined by the sizes of inductor 210 and capacitor 220 and is given by the relationship:

$$\omega = \frac{1}{\sqrt{LC}} \quad [1]$$

in which ω is the radian frequency, L is the inductance of inductor 210, and C is the capacitance of capacitor 220. Since the inductance and capacitance may not be precisely controlled over manufacturing process variations, there may be large initial errors in desired frequency. In addition, since the inductance and capacitance may depend upon temperature, then the frequency of CLOCK_OSC can vary with temperature, which reduces the frequency accuracy further.

Without compensation of the initial frequency error, oscillator 200 cannot be used in certain applications which require an accurate clock frequency reference, such as data transmission and data reception. To provide the compensation, known integrated resonant LC oscillators make the capacitance of capacitor 220 variable. However tuning capacitor 220 introduces additional problems. In order to be tunable, capacitor 220 requires a large number of switchable capacitance legs. These switchable capacitance legs can be implemented with a combination of capacitors in series with metal-oxide-semiconductor (MOS) transistor switches for coarse tuning, and a voltage-controlled varactor for fine tuning. However, these added devices degrade the quality factor of the tank, complicate the temperature coefficient, contribute additional noise to the oscillator, and may enhance sensitivity to mechanical strain and aging of the tank resonant frequency.

In order to compensate for the large temperature coefficient of the tank resonant frequency, oscillator 200 can be calibrated periodically during operation. However periodic calibration consumes power, adds latency, and may cause excessive amounts of unwanted noise. Moreover when oscillator 200 is used in signal transmission or reception, the speed of the temperature compensation may be too slow for temperature transients introduced by long transmissions following periods of inactivity.

Figure 3:
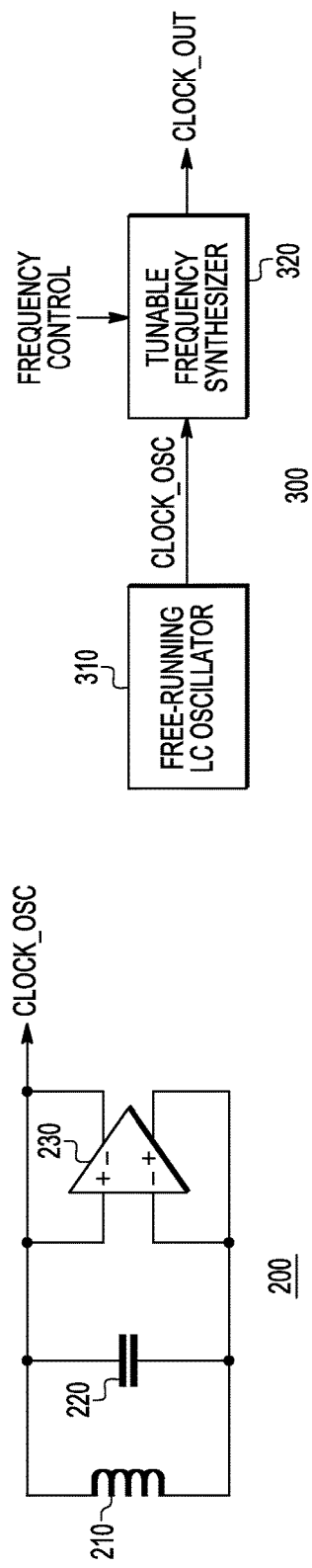
FIG. 3 illustrates in block diagram form a clock generator according to an embodiment of the present invention.

FIG. 3 illustrates in block diagram form a clock generator 300 according to an embodiment of the present invention. Clock generator 300 includes a free running LC oscillator 310 and a tunable frequency synthesizer 320. Free-running LC oscillator 310 has an output for providing the CLOCK_OSC signal. Free-running LC oscillator 310 is considered to be free-running because it does not have any active control to adjust its output frequency during normal operation. Thus the frequency of the CLOCK_OSC signal will be set using the design characteristics of its inductor and capacitor, but will vary according to process characteristics of the integrated circuit manufacturing process during its fabrication, and operating conditions such as the power supply voltage and the die temperature. Thus free-running oscillator 310 has a significant degree of variability in its output frequency that will vary from chip to chip and as operating conditions vary.

Tunable frequency synthesizer 320 has a first input for receiving the CLOCK_OSC signal, a second input for receiving a signal labeled "FREQUENCY CONTROL", and an output for providing the CLOCK_OUT signal. Tunable frequency synthesizer 320 adjusts the ratio between CLOCK_OUT and CLOCK_OSC signals based on the FREQUENCY CONTROL signal. In some embodiments, the FREQUENCY CONTROL signal may be set according to the factors that affect the oscillation frequency of free-running LC oscillator 310 such as temperature, operating voltage, and the like, as well as calibration data to reflect the actual resonant frequency of CLOCK_OSC in the particular integrated circuit. The calibration data can be measured at one or more temperatures during final test, and programmed into the integrated circuit.

Tunable frequency synthesizer 320 provides fine adjustment of the frequency of the CLOCK_OUT signal based on the FREQUENCY CONTROL signal. In one embodiment, tunable frequency synthesizer 320 is based on a fractional-N PLL which has the ability to provide fractional divider values for smaller frequency steps and thus provides more precise frequency control than an integer PLL. In other embodiments, tunable frequency synthesizer 320 can use any of a variety of other architectures, including a digital PLL, an integer PLL with a pre-divider, a stand-alone fractional divider, a frequency locked loop, and the like.

By using a free-running LC oscillator, clock generator 300 takes advantage of modern integrated circuit manufacturing processes that include the ability to form reasonably high quality inductors on-chip, as well as digital compensation in tunable frequency synthesizer 320 for the variations in the CLOCK_OSC signal. Clock generator 300 uses tunable frequency synthesizer 320 to compensate for the high degree of variability of free-running LC oscillator 310. By using this technique, clock generator 300 is able to achieve similar accuracy to a crystal-based clock generator 100 of FIG. 1, without the expense of an external crystal.

Figure 4:
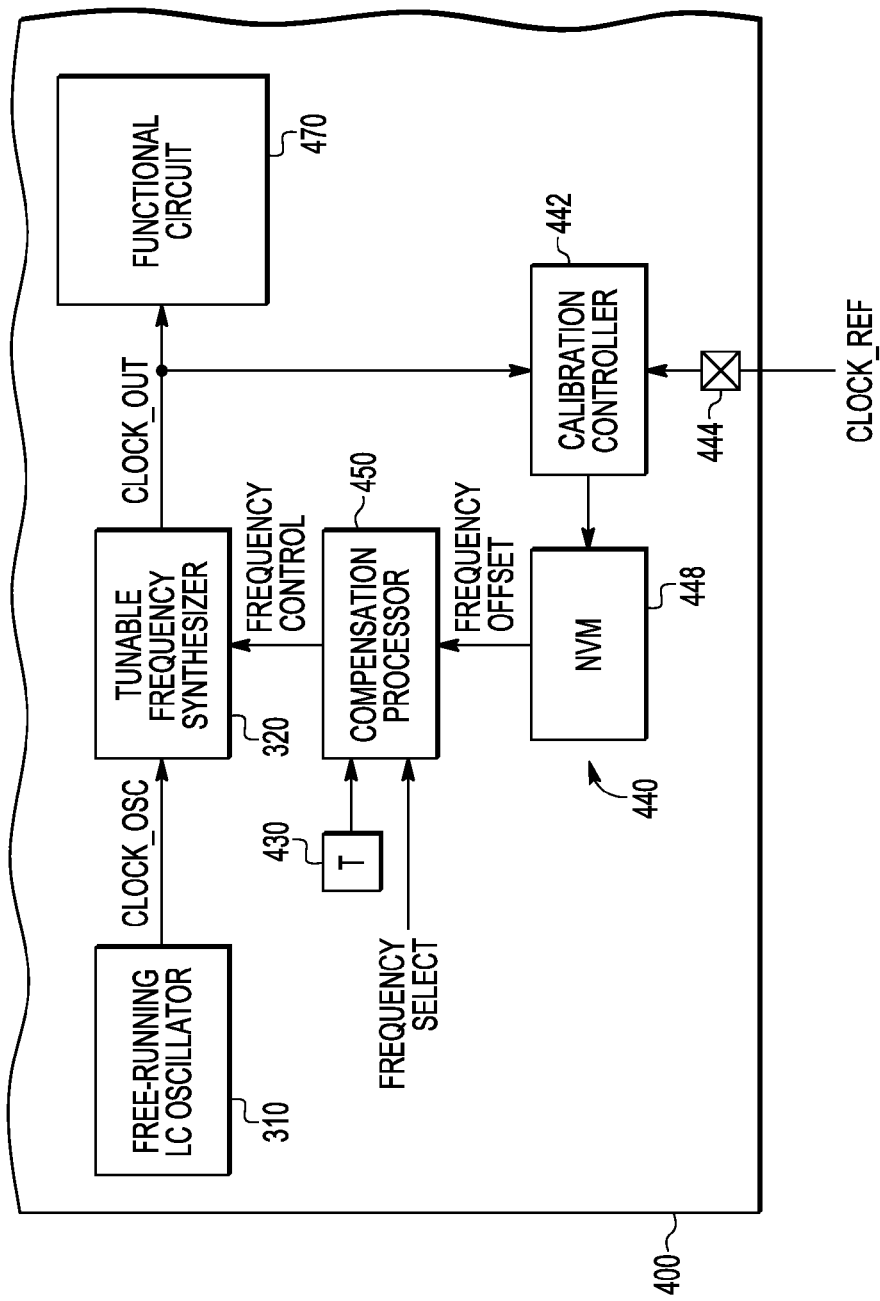
FIG. 4 illustrates in partial block diagram and partial schematic form an embodiment of an integrated circuit using the clock generator of FIG. 3.

FIG. 4 illustrates in partial block diagram and partial schematic form an embodiment of an integrated circuit 400 using clock generator 300 of FIG. 3. Integrated circuit 400 includes free-running LC oscillator 310 and tunable frequency synthesizer 320 as previously shown in FIG. 3, but also additional circuits for the practical implementation of integrated circuit 400. These additional circuits include a temperature sensor 430 and a calibration circuit 440, both of which measure characteristics of free-running LC oscillator 310 and provide inputs to a compensation processor 450, and a functional circuit 470 that operates using the CLOCK_OUT signal.

Temperature sensor 430 is thermally coupled to free-running oscillator 310. For example, it may be placed within or adjacent to the portion of integrated circuit 400 in which free-running oscillator 310 is located. Temperature sensor 430 has an output for providing a signal representative of the temperature of free-running oscillator 310.

Calibration circuit 440 includes a calibration controller 442 and a non-volatile memory 448. Calibration controller 442 has a first input connected to the output of tunable frequency synthesizer 320 for receiving the CLOCK_OUT signal, a second input connected to an integrated circuit terminal 444 for receiving an external signal labeled "CLOCK_REF", and an output terminal. CLOCK_REF is an external signal that may be generated, for example, on an integrated circuit tester and is a very accurate clock reference by which to calibrate the CLOCK_OUT signal. Non-volatile memory 448 has an input terminal connected to the output terminal of calibration controller 442, and an output terminal for providing a signal labeled "FREQUENCY OFFSET".

Calibration circuit 440 determines the offset of the CLOCK_OUT signal from the CLOCK_REF signal on a per-chip basis. Calibration controller 442 determines the offset, for example, at wafer probe test. In this example, integrated circuit terminal 444 may be present on the integrated circuit die but not bonded to the integrated circuit package and thus integrated circuit terminal 444 would not increase integrated circuit pin count nor consume a significant amount of area, thus not significantly increasing cost. In another embodiment, calibration controller 442 can determine the offset at two temperatures, 25 degrees Celsius (° C.) and 70° C., at final test and program the offset information using terminals bonded to pins of the integrated circuit package. Before volume production, a large quantity of chips could be measured to determine the temperature characteristics between and outside the two temperature measurements. Based on this statistical information (obtained before volume production) and the two measurements (obtained per chip), coefficients can be developed to describe a polynomial approximation of the required frequency adjustment based on the measured temperature. These coefficients can be programmed into non-volatile memory 448.

Calibration controller 442 stores the FREQUENCY OFFSET in non-volatile memory 448 so that it will be persistent when power is removed from integrated circuit 400. Non-volatile memory 448 can be implemented by a variety of technologies, such as floating-gate memory which is one-time programmable, fuses, or antifuses. Non-volatile memory 448 includes both the memory cells and a set of sense amplifiers to sense their contents and provide them as the FREQUENCY OFFSET signal to compensation processor 450 during operation. In this way, calibration need only be performed during factory test. In one example, the calibration can be performed at room temperature, and tunable frequency synthesizer 320 can use the FREQUENCY OFFSET and T signals to adjust the parameters of the PLL frequency synthesizer accordingly to compensate the CLOCK_OUT signal dynamically. In another example, the calibration can be performed using two measurements, one at room temperature and the other at a higher temperature such as 70° C., and the adjustment can be determined based on both the T signal and a complex relationship between temperature and frequency deviation, such as a function that is determined by polynomial curve-fitting to the two measurements.

Note that as contemplated herein, the FREQUENCY OFFSET signal can assume a variety of forms. In one form, it is a direct measure of one or more frequency deviations of the CLOCK_OUT signal from the CLOCK_REF signal at one or more temperatures. In another form, it can indicate frequency deviations indirectly, such as by including the coefficients of a polynomial formula to compensate for the temperature dependency of free running oscillator 310 through appropriate adjustments in the FREQUENCY CONTROL signal.

Compensation processor 450 has a first input connected to the output of temperature sensor 430, a second input for receiving the FREQUENCY SELECT signal, a third input for receiving the FREQUENCY OFFSET signal, and an output for providing the FREQUENCY CONTROL signal.

Functional circuit 470 has a clock input terminal for receiving the CLOCK_OUT signal from tunable frequency synthesizer 320. Examples of functional circuits include mixers of radio frequency receivers, radio frequency transmitters, precision real time clocks, and the like. In other embodiments, integrated circuit 400 can be a dedicated clock generator chip and these chips will not include functional circuits like functional circuit 470.

Integrated circuit 400 includes two main mechanisms for practical implementation of clock generator 300. First, it includes temperature sensor 430 to measure the temperature at a location on the integrated circuit die close to or integral with free-running oscillator 310. Thus the output of temperature sensor 430 indicates the deviation from a nominal temperature such as room temperature, and compensation processor 450 uses the temperature measurement to adjust the multiplication factor of tunable frequency synthesizer 320.

Second, integrated circuit 400 includes calibration circuit 440 to determine the offset in frequency from a reference frequency under known environmental conditions, such as at room temperature with a power supply voltage equal to its nominal value. For example, calibration circuit 440 can be used during factory test to determine room temperature offset. In one example, a VLSI tester uses a precise reference frequency such as an atomic clock to determine this frequency offset, and stores the value in non-volatile memory 448. Moreover the FREQUENCY OFFSET can be multiple values or a table of values that compensation processor 450 can use to form the FREQUENCY CONTROL signal based on the measured temperature T.

In other embodiments, calibration controller 442 may reside outside integrated circuit 400 (e.g. as part of the test equipment). In these embodiments, integrated circuit 400 would provide the CLOCK_OUT signal to an external terminal, and an external calibration controller or external test equipment such as a production integrated circuit tester would compare the CLOCK_OUT signal to a precision clock reference signal to determine compensation coefficients and program the compensation coefficients into non-volatile memory 448. These compensation coefficients may be based on both a combination of a large amount of characterization data (using many integrated circuits), and the frequency offset measurement of integrated circuit 400 at one or more temperatures.

Moreover in still other embodiments integrated circuit 400 can include additional circuits to measure other characteristics. These include power supply voltage, process variables such as transistor thresholds and polysilicon sheet resistance, and the like.

When the temperature sensor and calibration circuits are used, integrated circuit 400 provides a very stable clock reference using an inexpensive on-chip LC oscillator. Moreover, integrated circuit 400 is able to make use of modern integrated circuit manufacturing technologies that allow the fabrication of relatively high-quality inductors on chip. In addition, a precise clock reference need not be connected to calibration controller 442 during normal operation, but only used for calibration during manufacturing test. Thus an actual implementation can conveniently use the calibration data obtained during factory to adjust the parameters of tunable frequency synthesizer 320 during operation.

Free-running LC oscillator 310 can be any oscillator that operates in a free-running mode in which its frequency is not controlled during operation, such as oscillator 200 of FIG. 2 or the passively compensated oscillators disclosed in U.S. Pat. No. 7,777,585. Since it does not include complex control, it is much simpler in design than tunable oscillators. Moreover by moving the frequency adjustment to tunable frequency synthesizer 320, the clock generator avoids multiplying frequency tuning errors.

Figure 5:
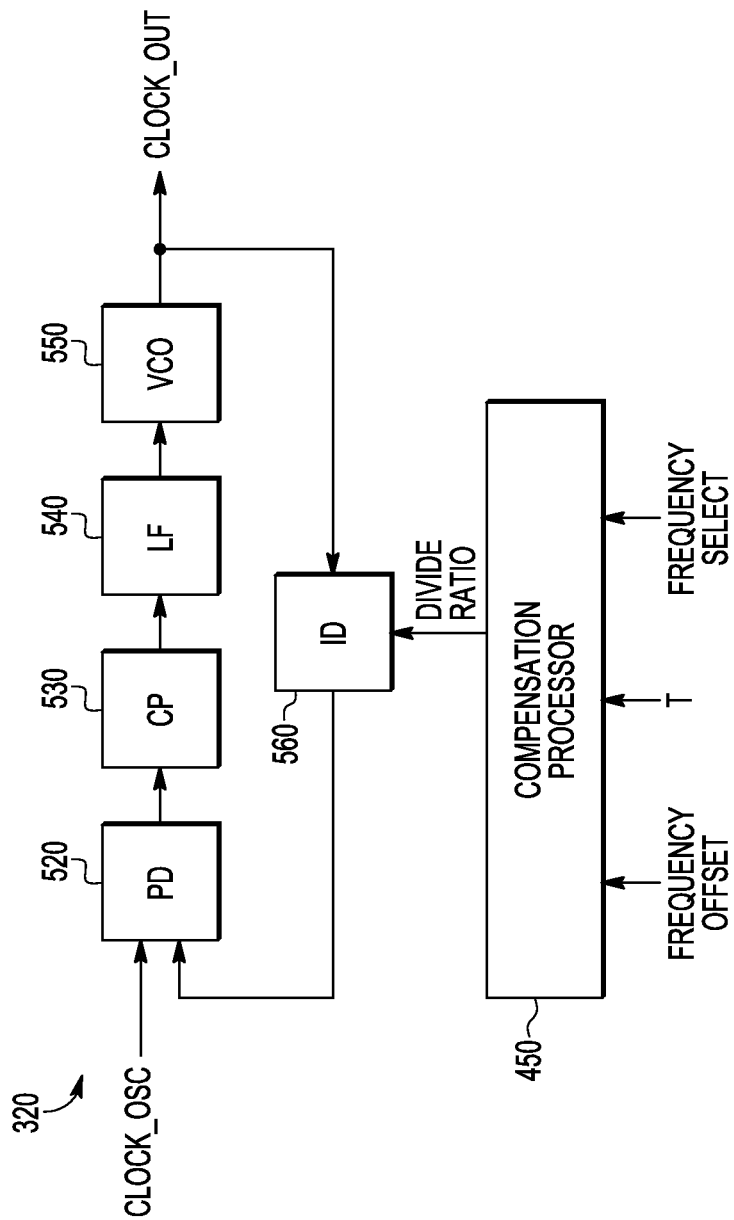
FIG. 5 illustrates in block diagram form a portion of a clock generator including a fractional-N implementation of the tunable frequency synthesizer of FIG. 3.

FIG. 5 illustrates in block diagram form a portion of a clock generator 500 including a fractional-N implementation of tunable frequency synthesizer 320 of FIG. 3. As shown in FIG. 5, tunable frequency synthesizer 320 includes generally a phase detector 520 labeled "PD", a charge pump 530 labeled "CP", a loop filter 540 labeled "LF", a voltage controller oscillator 550 labeled "VCO", an interpolative divider 560 labeled "ID", and compensation processor 450. Phase detector 520 has a first input for receiving the CLOCK_OSC signal, a second input, and an output. Charge pump 530 has an input connected to the output of phase detector 520, and an output. Loop filter 540 has an input connected to the output of charge pump 530, and an output. Voltage controlled oscillator 550 has an input connected to the output of loop filter 540, and an output for providing the CLOCK_OUT signal. Interpolative divider 560 has an input for receiving the CLOCK_OUT signal, a control input for receiving a signal labeled "DIVIDE RATIO", and an output connected to the second input of phase detector 520. Compensation processor 450 has a first input for receiving the FREQUENCY OFFSET signal, a second input for receiving the T signal, a third input for receiving the FREQUENCY SELECT signal, and outputs for providing the DIVIDE RATIO signal.

Tunable frequency synthesizer 320 operates like most PLLs except that it uses an interpolative divider 560 to allow the loop divider ratio to be a fractional value. Thus the frequency of the CLOCK_OUT signal can be controlled in smaller steps by the appropriate choices of the divide ratio. Phase detector 520 senses a difference in edges between the CLOCK_OSC signal received at its first input, and the divided CLOCK_OUT signal received at its second input, and provides its output based on the phase difference so detected. For example, assume that CLOCK_OUT is too low. The rising edge of the CLOCK_OSC signal will lead the rising edge of the feedback clock signal, causing phase detector 520 to provide its output in a high state. Charge pump 530 provides a pump up signal in response. Loop filter 540 is a lowpass filter, i.e. an integrator, which increases the voltage at its output in proportion to the period of time that the pump up signal is active. Thus the activation of the pump up signal causes the input of voltage controlled oscillator 550 to increase and voltage controlled oscillator 550 to increase the frequency of the CLOCK_OUT signal. Through this feedback action, the fractional-N PLL frequency synthesizer eventually locks such that the CLOCK_OUT signal has a frequency equal to the frequency of the CLOCK_OSC signal times the effective DIVIDE RATIO. Compensation processor provides the DIVIDE RATIO as a function of time, and in one form uses a delta-sigma modulator to provide the DIVIDE RATIO with noise shaping.

Interpolative divider 560 compensates for phase noise while allowing fractional values for the divide ratio N. In one example, interpolative divider 560 includes a dual-modulus prescaler that has two integer divide ratios. Interpolative divider 560 allows the effective divider value N to be a fraction by varying the duty ratio between, for example, N and N+1. It generally can include components such as a sigma-delta modulator to vary the duty ratio appropriately. In general, fractional-N PLLs can cause increase phase noise, i.e. jitter, in the CLOCK_OUT signal compared to integer-N dividers. Accordingly, interpolative divider 560 includes an interpolator to reduce this phase noise using techniques such as the technique disclosed in U.S. Patent Publication No. 2014/0055179, published Feb. 27, 2014. In another example, interpolative divider 560 includes a multi-modulus prescaler that allows more than two modulus values.

Compensation processor 450 adjusts the DIVIDE RATIO parameters according to the FREQUENCY OFFSET, T, and FREQUENCY SELECT signals. In one form, it uses two-point polynomial curve fitting based on two measurements of frequency deviation versus temperature, such as at room temperature and at the normal high temperature of final test that is related to its specified temperature range, and provides the values of the DIVIDE RATIO based on the actual temperature T and the polynomial so derived.

Note that the fractional-N PLL frequency synthesizer used in clock generator 500 is merely one example of a variety of well-known fractional-N PLL frequency synthesizers. Many other known fractional-N architectures are suitable for use in tunable frequency synthesizer 320.

Figure 6:
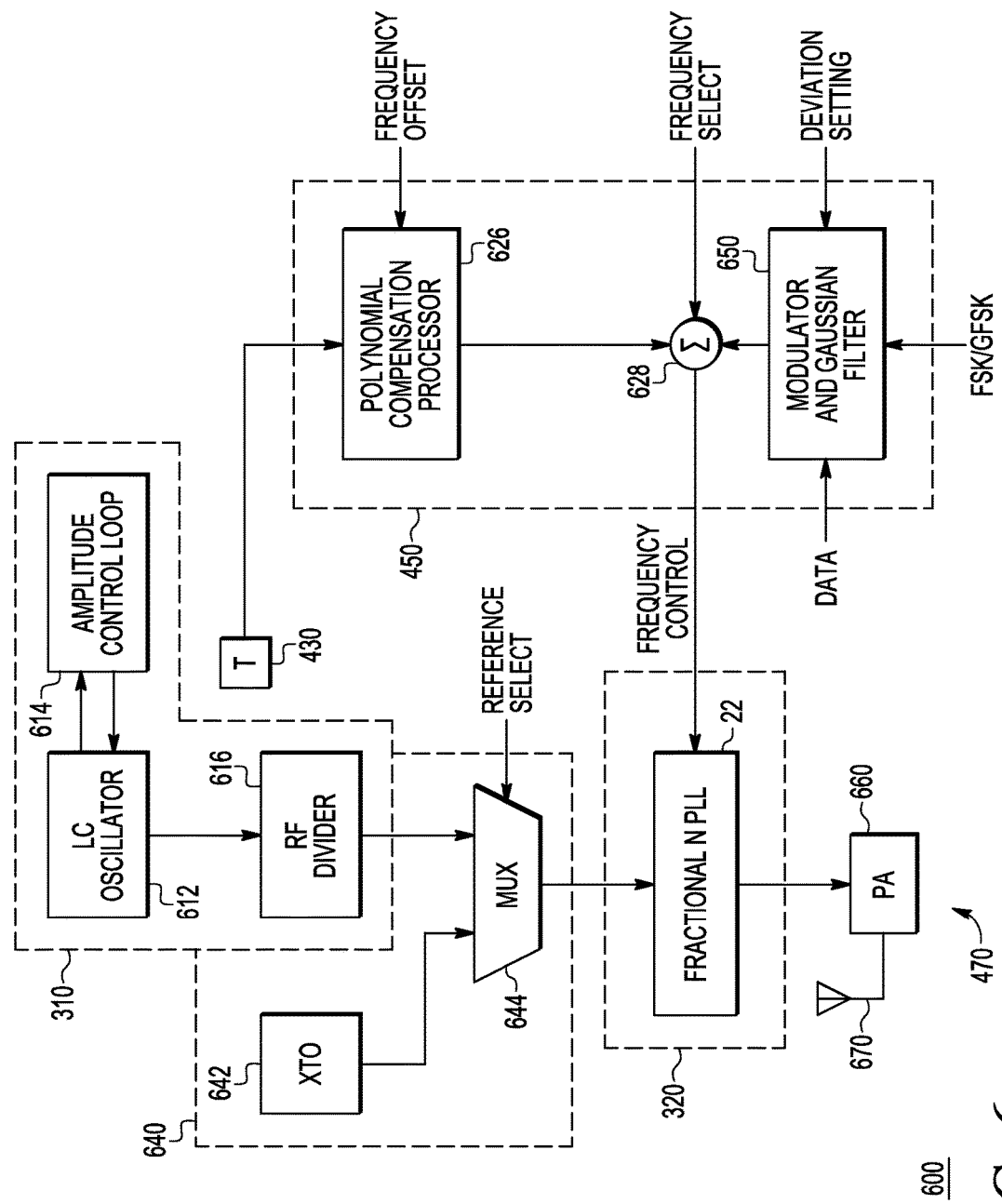
FIG. 6 illustrates in partial block diagram and partial schematic form another embodiment of an integrated circuit using the clock generator of FIG. 3.

FIG. 6 illustrates in partial block diagram and partial schematic form another embodiment of an integrated circuit 600 using clock generator 300 of FIG. 3. Integrated circuit 600 includes particular implementations of free-running oscillator 310 and tunable frequency synthesizer 320 as previously shown in FIG. 3, but also additional circuits for practical implementation of integrated circuit 600. These additional circuits include temperature sensor 430 and functional circuit 470 as shown in FIG. 4, a clock reference selection circuit 640, and a modulator and Gaussian filter 650. As shown in FIG. 6, compensation processor 450 also includes a data modulation function that will be described below, and as part of the data modulation function it additionally receives a data signal labeled "DATA", a control signal labeled "DEVIATION SETTING", and a control signal labeled "FSK/GFSK".

Free-running LC oscillator 310 includes an LC oscillator 612, an amplitude control loop 614, and a radio frequency (RF) divider 616. LC oscillator 612 does not have a frequency control input and therefore is free-running, but has an input for determining a gain of its amplifier (not shown), a first output for providing an oscillator signal, and a second output for providing a signal indicative of the amplitude of the oscillator signal. In one specific example, the two outputs can be the same signal. Amplitude control loop 614 has an input connected to the second output of LC oscillator 612, and an output connected to the input of LC oscillator 612. LC oscillators perform best when tuned at several GHz. These frequencies are usually not suitable for a frequency synthesizer and so RF divider 616 can be used to bring these frequencies within a usable range. RF divider 616 has an input connected to the first output of LC oscillator 612, and an output for providing the CLOCK_OSC signal.

Clock reference selection circuit 640 includes a crystal oscillator labeled "XTO", and a multiplexer 644. Crystal oscillator 642 has an output for providing an oscillator clock signal. Multiplexer 644 has a first input connected to the output of crystal oscillator 642, a second input connected to the output of free-running LC oscillator 310, a control input for receiving a signal labeled "REFERENCE SELECT", and an output. Clock reference selection circuit 640 provides flexibility in oscillator source selection which is useful for certain chips such as microcontrollers (MCUs) that may be programmed for a variety of applications. Crystal oscillator 642 provides an oscillator clock signal based on an off-chip crystal but also includes on-chip components such as an inverter and possibly tank capacitors and a feedback resistor. As is known, a crystal provides a frequency reference with an accuracy of, for example, about 10-20 parts per million (PPM), and its added cost may be acceptable in some applications.

Integrated circuit 600 adds two features to allow for better implementation of free-running LC oscillator 310. First, amplitude control loop 614 sets the gain of LC oscillator 612 with AGC-type feedback techniques to keep the amplitude of the peak signal at a desired operating point. Note that even with amplitude control loop 614, free-running LC oscillator 310 is still free-running because it does not have any active control to adjust its output frequency during normal operation. While amplitude control loop 614 uses active elements, these active elements adjust the amplitude of the output signal but have a negligible influence on frequency.

Second, free-running LC oscillator 310 includes RF divider 616 to allow a selection of the range of values for the CLOCK_OSC signal. For example, integrated inductors can be manufactured on the order of a few up to several hundred nano-Henrys, with capacitances from fractions of pico-Farads (pF) to a few tens of nano-Farads (nF). Thus the output frequency, which is determined by $1/\sqrt{LC}$, may be significantly higher than desired. However RF divider 616 allows the CLOCK_OSC input to the tunable frequency synthesizer 320 to be closer to usable frequencies.

As shown in FIG. 6, tunable frequency synthesizer 320 is implemented using a fractional-N PLL 622. Fractional-N PLL 622 has an input for receiving the output of clock reference selection circuit 640, a control input for receiving the FREQUENCY CONTROL signal, and an output for providing a CLOCK_OUT signal.

Compensation processor 450 includes a polynomial compensation processor 626, a summing device 628, and a modulator and Gaussian filter 650. Polynomial compensation processor 626 has a first input for receiving the T signal, a second input for receiving the FREQUENCY OFFSET signal, and an output. Summing device 628 has a first input connected to the output of polynomial compensation processor 626, a second input for receiving the FREQUENCY SELECT signal, a third input for receiving a modulated data signal, and an output connected to the control input of fractional-N PLL 622 for providing the FREQUENCY CONTROL signal thereto.

Modulator and Gaussian filter 650 has a first input for receiving the DATA signal, a second input for receiving the FSK/GFSK control signal, a third input for receiving the DEVIATION SETTING signal, and an output connected to the third input of summing device 628. Modulator and Gaussian filter 650 performs a selected one of the frequency shift keying (FSK) and Gaussian frequency shift keying (GFSK) modulation techniques. Thus it develops a frequency offset based on the DATA signal of an amount determined by the DEVIATION SETTING, and optionally spreads the signal using a Gaussian filter in GFSK mode. In other embodiments, modulator and Gaussian filter 650 can be easily modified to support similar modulation techniques such as phase shift keying (PSK), 3-level FSK (3FSK), and the like.

Functional circuit 470 includes a power amplifier 660 labeled "PA" and an antenna 670. Power amplifier 660 has an input connected to the output of fractional-N PLL 622, and an output connected to antenna 670. Antenna 670 is external to integrated circuit 600.

In the embodiment shown in FIG. 6, modulator and Gaussian filter 650 and fractional-N PLL 622 together form a data transmitter. Polynomial compensation processor 626 receives the temperature signal T and converts it into a corresponding offset based on the FREQUENCY OFFSET value. In one embodiment, the FREQUENCY OFFSET corresponds to the measured deviation of the CLOCK_OSC signal from the CLOCK_REF signal at a given temperature, and polynomial compensation processor 626 forms the adjustment factor by using a polynomial equation based on the two measurements and polynomial curve fitting. In various embodiments, polynomial compensation processor 626 can be implemented using hardware circuitry or with a microcontroller running firmware. For example in a hardware implementation, the T signal can be used to index into a lookup table that contains pre-computed adjusted offset values.

Modulator and Gaussian filter 650 modulates the DATA signal by an amount equal to plus or minus the DEVIATION SETTING from the carrier frequency (indicated by the FREQUENCY SELECT signal). Summing device 628 sums this output of polynomial compensation processor 626, the FREQUENCY SELECT signal, and the modulated DATA signal to provide the FREQUENCY CONTROL signal to fractional-N PLL 622.

Integrated circuit 600 illustrates the flexibility of clock generator 300 of FIG. 3 when used to implement a data transmitter.

Figure 7:
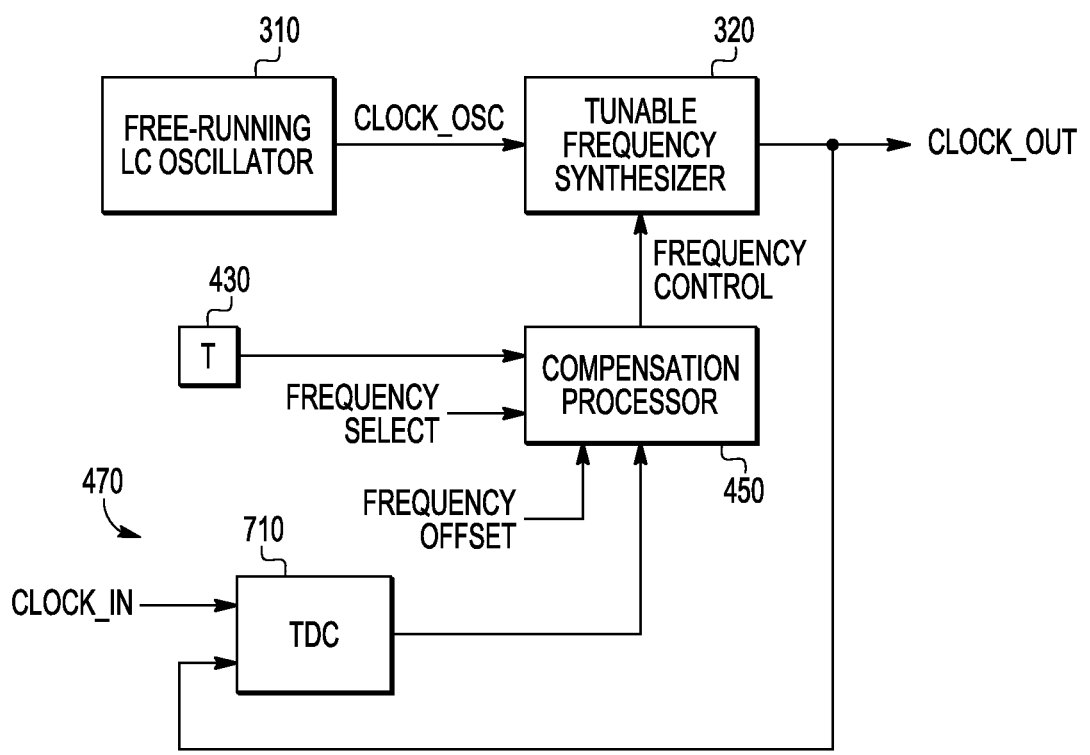
FIG. 7 illustrates a jitter-cleaning PLL using the clock generator of FIG. 3 according to another embodiment.

FIG. 7 illustrates a jitter-cleaning PLL 700 using clock generator 300 of FIG. 3 according to another embodiment. In addition to free-running LC oscillator 310, tunable frequency synthesizer 320, temperature sensor 430, and compensation processor 450, jitter-cleaning PLL 700 includes a time-to-digital converter 710 labeled "TDC". Time-to-digital converter 710 has a first input for receiving an input clock signal labeled "CLOCK_IN", a second input for receiving the CLOCK_OUT signal, and an output connected to an additional input of compensation processor 430.

Signal CLOCK_IN is an input clock signal that is susceptible to jitter, such as one generated during clock recovery of a modulated data signal. Time-to-digital converter 710 determines a frequency difference by examining the difference in phase between the edges of CLOCK_IN and CLOCK_OUT, and provides a digital output signal that is proportional to the phase difference between CLOCK_IN and CLOCK_OUT. Compensation processor 430 forms the FREQUENCY CONTROL signal in response to this additional input. Note that since the loop is a closed loop locked to the CLOCK_IN signal, the operation of the loop will adjust tunable frequency synthesizer 320 as appropriate without the need for temperature control and calibration. Thus compensation processor 450 can be used to implement a clock generator as described above in one mode, or be responsive to the output of time-to-digital converter 710 as a closed loop jitter cleaning PLL in another mode. As shown in FIG. 5 above, the FREQUENCY CONTROL signal can be a time-dependent divide ratio to implement fractional-N PLL frequency synthesizer. The operation of the closed loop makes the frequency of the CLOCK_OUT signal equal to the frequency of the CLOCK_IN signal. Jitter-cleaning PLL 700 uses the lowpass filtering capability of compensation processor 450 to reduce the jitter in the CLOCK_IN signal, and illustrates another example of the flexibility of clock generator 300 of FIG. 3.

Spur Management

As explained above, a free-running oscillator has a nominal frequency based on the design of its components which has a degree of variability based on manufacturing process, power supply voltage, and die temperature. Because of this variability, in a variable clock frequency application occasionally the relationship between the natural frequency of free-running oscillator 810 and the desired frequency of the CLOCK_OUT signal will create spurs. A spur is any unwanted tonal energy generated by the device itself. A spur can harm the signal in the wanted channel either by acting as a co-channel, or if it corrupts the VCO, by reciprocally mixing with large blockers and hence hurt the wanted channel.

A significant spur coupling mechanism can occur when the natural frequency of free-running oscillator 300 is harmonically related to the frequency of the CLOCK_OUT signal, or vice versa. It is harmonically related if the frequency of the CLOCK_OSC signal, or any harmonic thereof, falls within the bandwidth of the PLL from the frequency of the CLOCK_OUT signal. In these cases, the spurs can distort the received or transmitted signal that the CLOCK_OUT signal is used to receive or transmit. It would be desirable to provide a mechanism for use with the architecture of clock generator 300 to reduce or eliminate these potential spurs.

Figure 8:
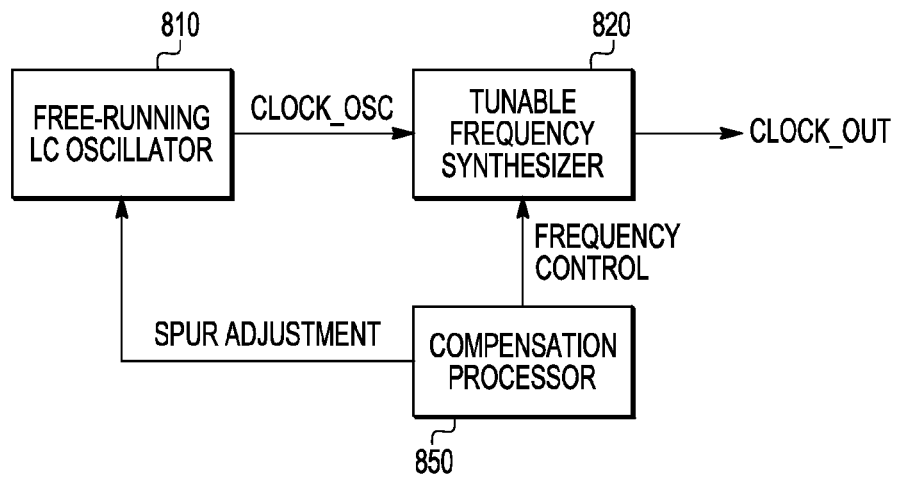
FIG. 8 illustrates in block diagram form a clock generator according to another embodiment of the present invention.

FIG. 8 illustrates in block diagram form a clock generator 800 according to another embodiment of the present invention. Clock generator 800 includes a free running LC oscillator 810, a tunable frequency synthesizer 820, and a compensation processor 850. Free-running LC oscillator 810 has an input for receiving a signal labeled "SPUR ADJUSTMENT", and an output for providing the CLOCK_OSC signal. Tunable frequency synthesizer 820 has a first input for receiving the CLOCK_OSC signal, a second input for receiving the FREQUENCY CONTROL signal, and an output for providing the CLOCK_OUT signal. Compensation processor 850 has inputs for receiving the FREQUENCY SELECT, FREQUENCY OFFSET, and T signals as illustrated in FIG. 4 above (not shown in FIG. 8), a first output for providing the FREQUENCY CONTROL signal, and a second output for providing the SPUR ADJUSTMENT signal.

Like free-running oscillator 310 of FIG. 3, free-running LC oscillator 810 is also considered to be free-running because it does not have any active control to adjust its output frequency during normal operation. The SPUR ADJUSTMENT signal is not a control signal for accurate frequency control, but rather a digital signal that provides a coarse "bump" in frequency. Compensation processor 850 determines whether or not to activate the SPUR ADJUSTMENT signal to avoid or mitigate the effect of spurs prior to normal operation, and does not change it during normal operation.

Compensation processor 850 uses the FREQUENCY SELECT, FREQUENCY OFFSET, and T signals to determine the FREQUENCY CONTROL signal. In addition, compensation processor 850 selectively activates the SPUR ADJUSTMENT signal if the frequency of CLOCK_OSC and the frequency of CLOCK_OUT are harmonically related. The SPUR ADJUSTMENT signal may also be activated if the CLOCK_OSC signal, or any of the CLOCK_OSC harmonics, is interfering with any of the functions of the system such as interference with a receive frequency or transmit frequency of a communications transceiver. For example if tunable frequency synthesizer 820 uses a fractional-N PLL, compensation processor 850 would form the FREQUENCY CONTROL signal as a DIVIDE RATIO. In this case, compensation processor 850 could determine whether the frequency of CLOCK_OSC and the frequency of CLOCK_OSC are harmonically related by examining the DIVIDE RATIO.

If the frequency of CLOCK_OSC and the frequency of CLOCK_OUT are harmonically related, then compensation processor 850 activates the SPUR ADJUSTMENT signal. In response to the activation of the SPUR ADJUSTMENT signal, free-running LC oscillator 810 adjusts the frequency of CLOCK_OSC by an amount equal to a small percentage of the original frequency. The nominal value of this amount can be set so that if the frequencies of the original CLOCK_OSC and CLOCK_OUT signals are harmonically related, then the frequencies of the new CLOCK_OSC and CLOCK_OUT signals will not be harmonically related, regardless of possible variations in process, voltage, and temperature.

Figure 9:
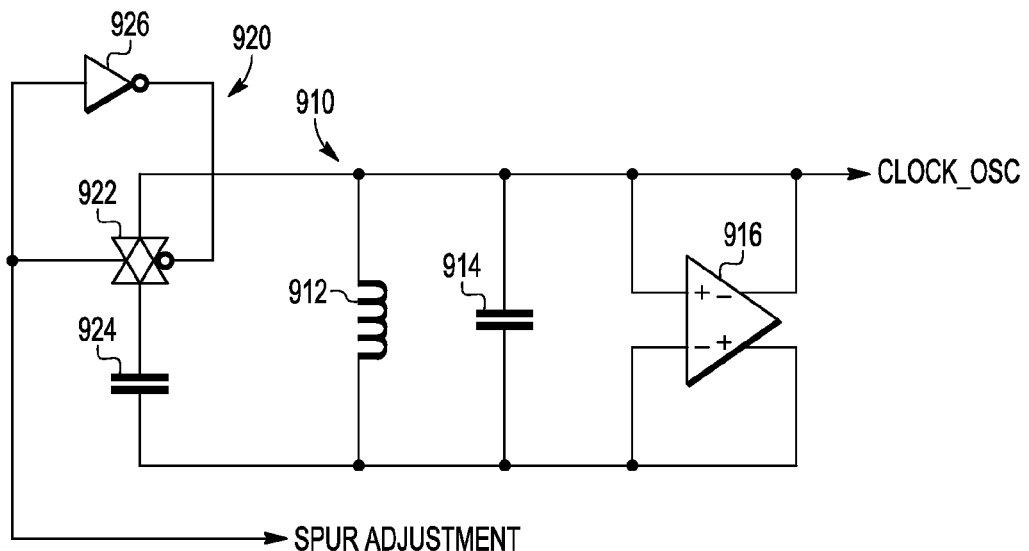
FIG. 9 illustrates in partial block diagram and partial schematic form an oscillator suitable for use in the clock generator of FIG. 8.

FIG. 9 illustrates in partial block diagram and partial schematic form an oscillator 900 suitable for use in clock generator 800 of FIG. 8. Oscillator 900 includes generally an LC oscillator 910 and a spur adjustment portion 920. LC oscillator 910 includes an inductor 912, a capacitor 914, and a transconductance amplifier 916. Inductor 912 has first and second terminals. Capacitor 914 has first and second terminals respectively connected to the first and second terminals of inductor 912. Transconductance amplifier 916 has a non-inverting input connected to the first terminals of inductor 912 and capacitor 914, an inverting input connected to the second terminals of inductor 912 and capacitor 914, an inverting output connected to the non-inverting input thereof and providing the CLOCK_OSC signal, and a non-inverting output connected to the inverting input thereof.

Spur adjustment portion 920 includes a transmission gate 922, a capacitor 924, and an inverter 926. Transmission gate 922 has a first bidirectional terminal connected to the first terminals of inductor 912 and capacitor 914, a second bidirectional terminal, a true control terminal for receiving the SPUR ADJUSTMENT signal, and a complement control terminal. Capacitor 924 has a first terminal connected to the second bidirectional terminal of transmission gate 922, and a second terminal connected to the second terminals of inductor 912 and capacitor 914. Inverter 926 has an input for receiving the SPUR ADJUSTMENT signal, and an output connected to the complement control terminal of transmission gate 922.

Inverter 926 and transmission gate 922 form a switched capacitor for selectively connecting capacitor 924 in parallel with inductor 912 and capacitor 914. Thus the increase in the capacitance due to the activation of SPUR ADJUSTMENT increases the frequency of free-running LC oscillator 900. Transmission gate 922 prevents a threshold voltage drop between the first terminal of capacitor 924 and the first terminals of inductor 912 and capacitor 914 regardless of whether the voltage at the first terminals of inductor 912 and capacitor 914 is rising or falling.

In other embodiments, an additional inductance instead of an additional capacitance can be switched into our out of free-running LC oscillator 900 based on the state of the SPUR ADJUSTMENT signal. Moreover if free-running LC oscillator 900 uses an alternate architecture such as RC or ring, a different type of adjustment appropriate for that architecture can be used.

Figure 10:
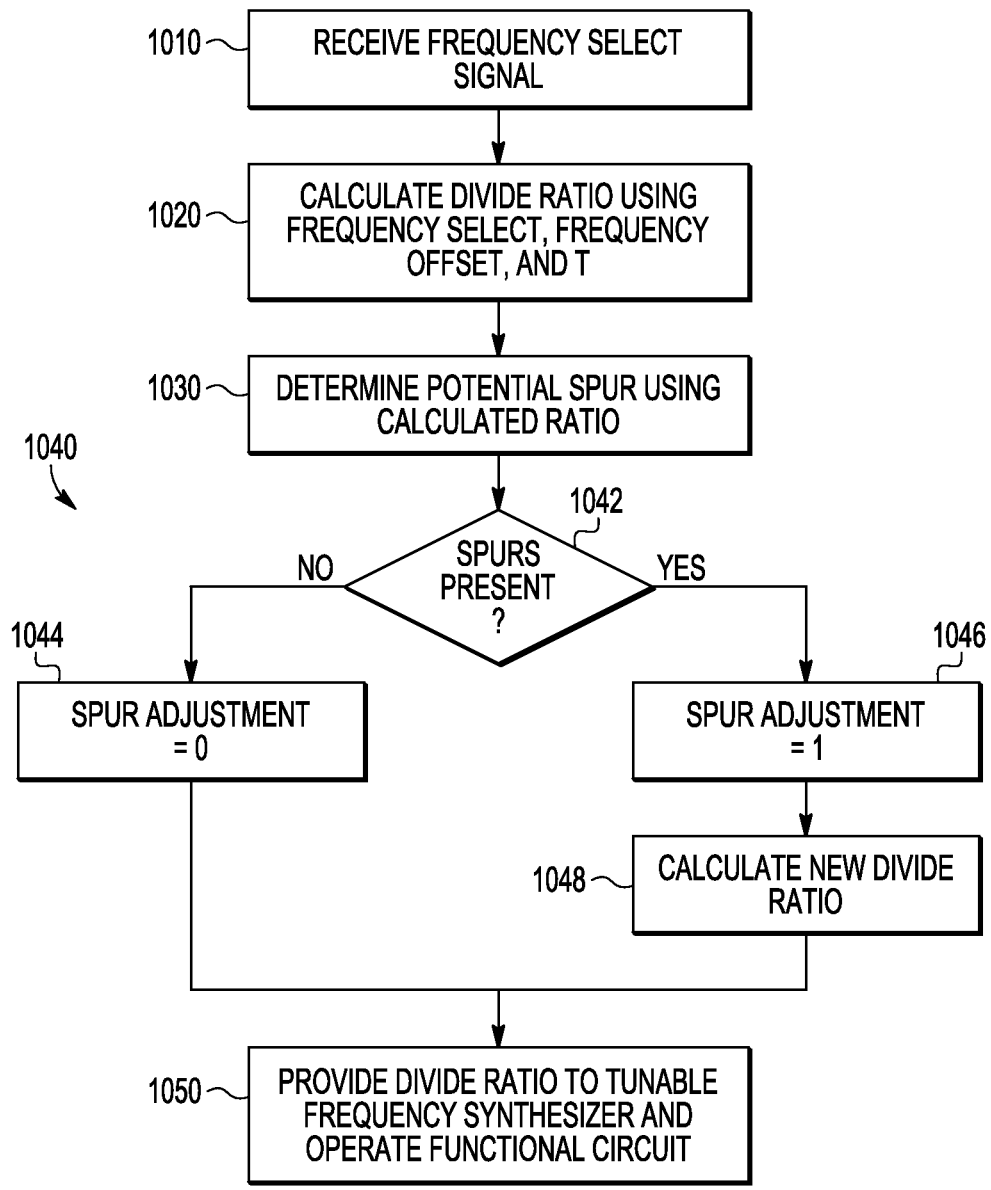
FIG. 10 illustrates a flow diagram related to the operation of the compensation processor of FIG. 8.

FIG. 10 illustrates a flow diagram 1000 related to the operation of compensation processor 850 of FIG. 8. At action box 1010, compensation processor 850 receives a new FREQUENCY SELECT signal. It can be received, for example, when a host processor selects a new channel for reception or transmission. In action box 1020, compensation processor 850 calculates the DIVIDE RATIO using the FREQUENCY SELECT, FREQUENCY OFFSET, and T signals. Then at action box 1030, compensation processor 850 determines whether a potential spur exists using the calculated DIVIDE RATIO. To take a simple example, if the DIVIDE RATIO is equal to 1:3.001, then CLOCK_OSC is harmonically related to CLOCK_OUT because the third harmonic of the CLOCK_OSC can be expected to fall in the bandwidth of the PLL. However if the divide ratio is 1:10.5, then the CLOCK_OSC and CLOCK_OUT signals are not harmonically related and the nearest spur will fall outside the bandwidth of the PLL.

Next, a set of steps 1040 is used to configure the clock generator. Decision box 1042 determines whether potential spurs are present. If there are no potential spurs present, then at action box 1044 compensation processor 850 sets the SPUR ADJUSTMENT signal to 0. If however there are potential spurs present, then at action box 1046 compensation processor 850 sets the SPUR ADJUSTMENT signal to 1, and at action box 1048 it calculates a new DIVIDE RATIO based on the new frequency setting. Note that the new frequency setting could be determined by adding an additional amount corresponding to the nominal value to the FREQUENCY OFFSET signal, or it could be indicated directly by the FREQUENCY OFFSET signal itself. Then at action box 1050, compensation processor 850 provides the DIVIDE RATIO (either the original one if SPUR ADJUSTMENT=0 or the new one if SPUR ADJUSTMENT=1) to tunable frequency synthesizer 820, and subsequently the functional circuit subsequently operates using the CLOCK_OUT signal.

Note that the spur compensation mechanism mentioned above can be used with other spur avoidance techniques, such as physical separation or isolation of circuits that can radiate energy around the chip. In addition to reduce cost, the oscillator in the tunable frequency synthesizer (such as VCO 550 of FIG. 5) can be implemented with a ring oscillator or resistor-capacitor (RC) oscillator that consumes less integrated circuit area than a corresponding LC oscillator. The ring or RC oscillator has higher phase noise than an LC oscillator, but this higher phase noise can be compensated for using a fractional-N PLL as described above. Moreover using a higher loop bandwidth for the PLL makes it possible to reduce the noise over a wider frequency band. An additional benefit of using a ring or RC oscillator is that the electromagnetic coupling between it and the free-running oscillator would be reduced.

To further reduce electromagnetic coupling between the VCO and free-running oscillator, it is possible to use inductors that have low electromagnetic pickup, such as "FIG. 8" inductors as disclosed in U.S. Pat. No. 8,494,470.

Figure 11:
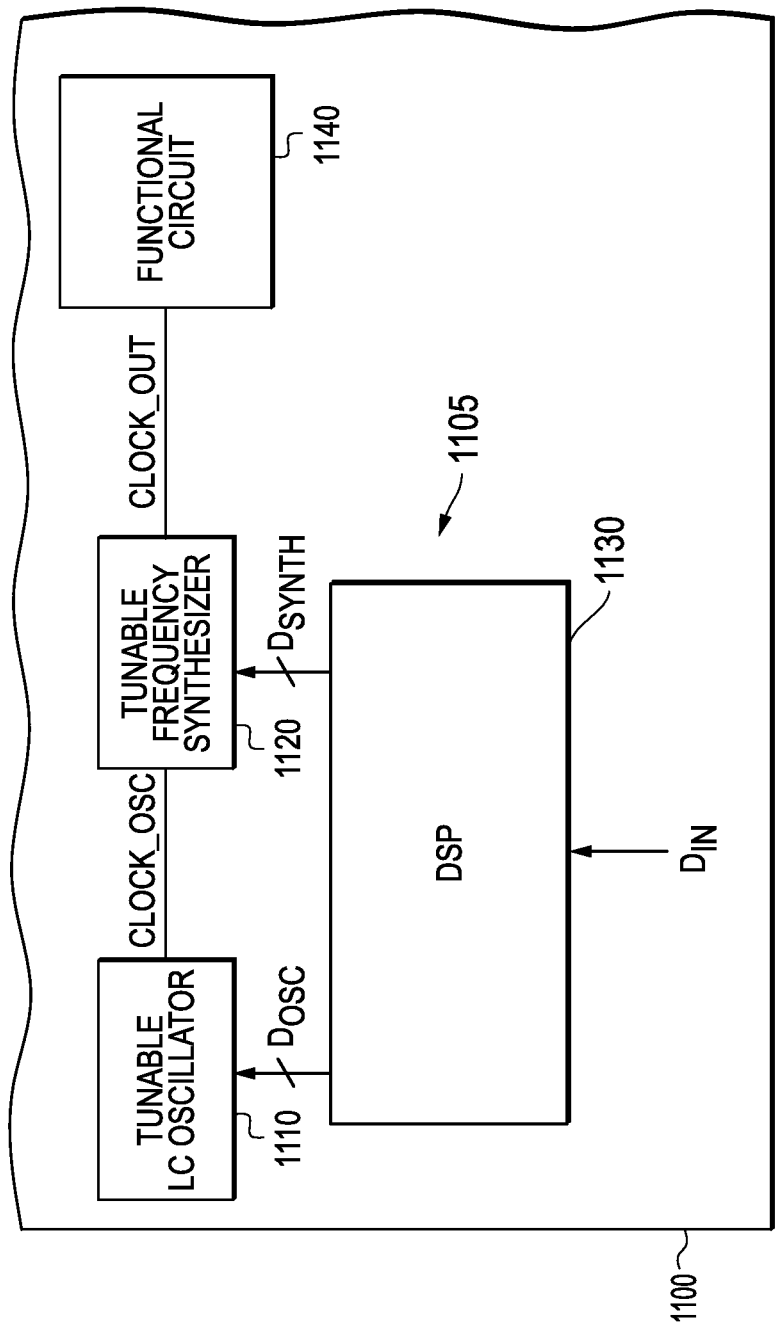
FIG. 11 illustrates in block diagram an integrated circuit having an integrated clock generator according to another embodiment.

FIG. 11 illustrates in block diagram an integrated circuit 1100 having an integrated clock generator 1105 according to another embodiment. Integrated circuit 1100 includes integrated clock generator 1105 and a functional circuit 1140. Integrated clock generator 1105 includes a tunable LC oscillator 1110, a tunable frequency synthesizer 1120, and a digital signal processor (DSP) 1130, all combined on integrated circuit 1100. Tunable LC oscillator 1110 has a control input for receiving an oscillator control signal labeled "$D_{OSC}$", and an output for providing clock signal CLOCK_OSC. Tunable frequency synthesizer 1120 has a clock input connected to the output of tunable LC oscillator 1110, a control input for receiving a synthesizer control signal labeled "$D_{SYNTH}$", and an output for providing clock signal CLOCK_OUT. DSP 1130 has an input for receiving a data signal labeled "$D_{IN}$", a first output connected to the control input of tunable LC oscillator 1110 for providing signal $D_{OSC}$ thereto, and a second output connected to the control input of tunable frequency synthesizer 1120 for providing signal $D_{SYNTH}$ thereto. Functional circuit 1140 has an input for receiving the CLOCK_OUT signal and operates in accordance with the CLOCK_OUT signal to perform its intended functions.

Integrated clock generator 1105 provides the CLOCK_OUT signal with a highly accurate frequency using a fully integrated LC oscillator, namely tunable LC oscillator 1110. Unlike oscillator 300 of FIG. 3, however, tunable LC oscillator 1110 is not free-running but supports tuning within a range. By controlling the frequency of both tunable LC oscillator 1110 and tunable frequency synthesizer 1120, integrated clock generator 1105 can achieve highly accurate frequency control while reducing oscillator complexity. For example, DSP 1130 can modulate the frequency of tunable LC oscillator 1110 while compensating for temperature dependence using tunable frequency synthesizer 1120. DSP 1130 receives signal $D_{IN}$ as a representation of a desired frequency for CLOCK_OUT, and generates oscillator control signal $D_{OSC}$ and synthesizer control signal $D_{SYNTH}$ to set CLOCK_OUT to the desired frequency under current operating conditions.

$D_{IN}$ may include or represent any or all of the types of information about setting or adjusting the frequency of CLOCK_OSC and CLOCK_OUT discussed above with respect to FIGS. 4-6. For example, $D_{IN}$ can indicate an operating parameter such as temperature or voltage, or the difference between a measured value and a nominal value of the operating parameter. $D_{IN}$ can also indicate a frequency selection within a range of supported frequencies. $D_{IN}$ can further indicate an offset in frequency between a desired frequency and an actual frequency that may be obtained through calibration using a precision off-chip frequency reference. $D_{IN}$ can also indicate a selected one of a set of discrete frequencies used to encode data, using a modulation technique such as FSK or GFSK, in which case it can also indicate a modulation mode and/or a frequency deviation between the supported states.

In response to $D_{IN}$, DSP 1130 allocates the frequency generation between DOSC and DSYNTH to achieve the desired frequency for CLOCK_OUT. In one embodiment, DSP 1130 further uses $D_{OSC}$ to compensate for static conditions while using $D_{SYNTH}$ to compensate for dynamic conditions such as variations in temperature and voltage or changing frequencies in response to a time-varying modulated data signal. Since $D_{OSC}$ only requires a relatively small tuning range to compensate for static offset, the number of relatively large switchable reactive elements can be made small.

Moreover the variability of $D_{OSC}$ can be kept small while accommodating a large range of statically selected frequencies using $D_{SYNTH}$ by generating $D_{SYNTH}$ based on both static conditions such as frequency selection as well as dynamic conditions. For example, one way to generate CLOCK_OUT at a frequency of 1.0 GHz is to set $D_{OSC}$ such that tunable LC oscillator 1110 provides the CLOCK_OSC signal at 25 MHz, and sets tunable frequency synthesizer 1120 to multiply the CLOCK_OSC signal by 40 while using fractional PLL synthesis techniques to vary the multiplication ratio to take into account measured temperature changes. However the 25 MHz frequency generated by tunable LC oscillator 1110 may also create undesirable spurs in functional circuit 1140. In this case, DSP 1130 can alter $D_{OSC}$ so that tunable LC oscillator 1110 outputs the CLOCK_OSC signal at 20 MHz, and $D_{SYNTH}$ so that tunable frequency synthesizer 1120 multiplies the CLOCK_OSC signal by 50 to obtain the same 1.0 GHz signal but without creating the harmful spur. Thus by providing flexibility in allocating the frequency generation between tunable LC oscillator 1110 and tunable frequency synthesizer 1120, integrated clock generator 1105 can avoid creating harmful spurs.

Yet another allocation of frequency generation is the case in which DSP 1130 uses $D_{OSC}$ to compensate for temperature compensation while using $D_{SYNTH}$ to modulate the frequency for a FSK or GFSK modulation scheme. In this example, the tuning range of tunable LC oscillator can also be made relatively small whereas tunable frequency synthesizer 1120 can accomplish larger changes in frequency using digital circuitry, thus reducing circuit size and complexity.

With these examples it should be apparent that the division of the frequency generation function between tunable LC oscillator 1110 and tunable frequency synthesizer 1120 can be made differently for different environments. Thus integrated clock generator 1105 provides a high degree of flexibility for implementing fully integrated frequency generation.

Figure 12:
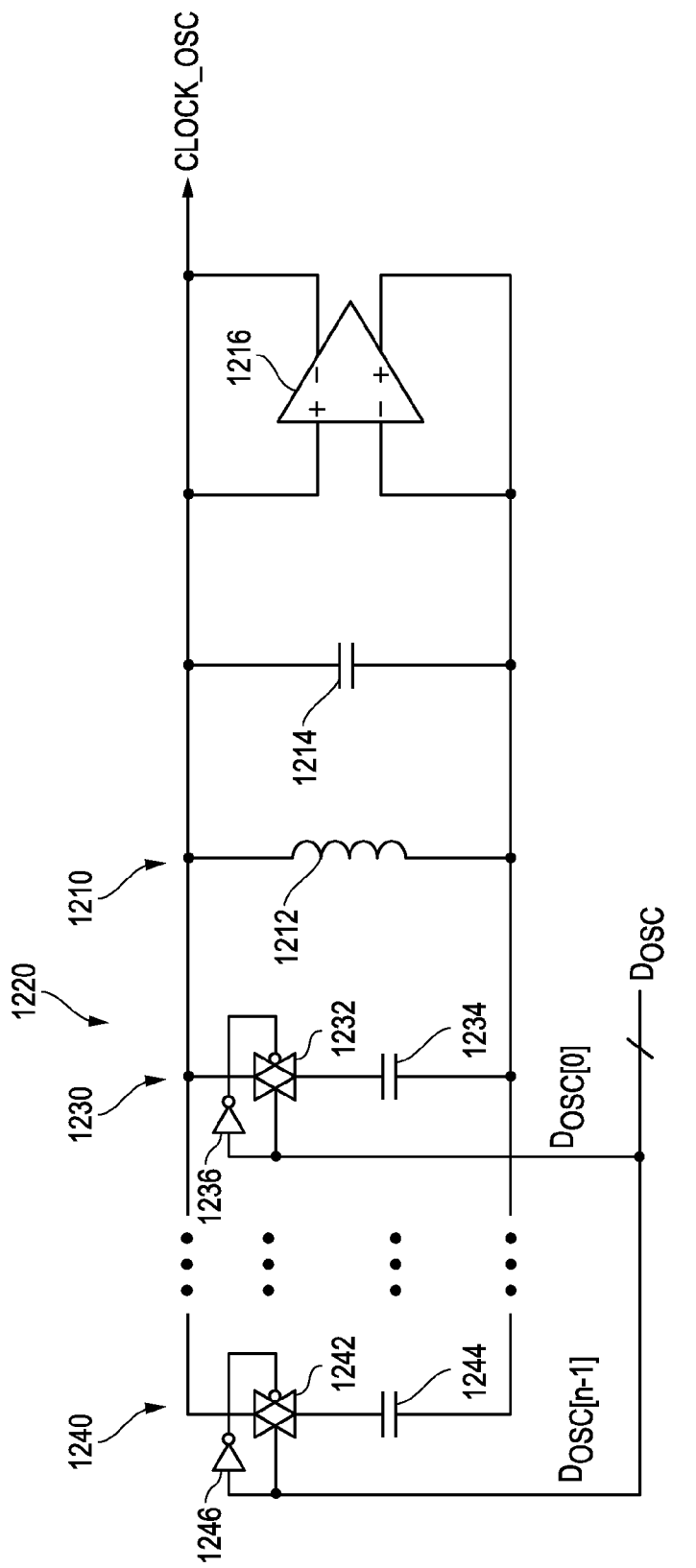
FIG. 12 illustrates in partial block diagram and partial schematic form a tunable LC oscillator that can be used as the tunable LC oscillator of FIG. 11.

FIG. 12 illustrates in partial block diagram and partial schematic form a tunable LC oscillator 1200 that can be used as tunable LC oscillator 1110 of FIG. 11. Tunable LC oscillator 1200 is a parallel resonant LC oscillator that includes an inductor 1212, a capacitor 1214, an operational amplifier 1216, and a tuning portion 1220. Inductor 1212 has a first terminal connected to the output of tunable LC oscillator 1200, and a second terminal connected to a reference terminal such as ground. Capacitor 1214 has a first terminal connected to the output of tunable LC oscillator 1200, and a second terminal connected to the reference terminal. Amplifier 1216 has a non-inverting input connected to the output of tunable LC oscillator 1200, an inverting input connected to the reference terminal, an inverting output connected to the output of tunable LC oscillator 1200 for providing the CLOCK_OSC signal, and a non-inverting output connected to the reference terminal.

Tuning portion 1220 includes a set of switched capacitors including two representative switched capacitors 1230 and 1240. Switched capacitor 1230 includes a transmission gate 1232, a capacitor 1234, and an inverter 1236. Transmission gate 1232 has a first signal terminal connected to the output of tunable LC oscillator 1200, a second signal terminal, a true control terminal for receiving a least significant bit of the oscillator control signal labeled "$D_{OSC}[0]$", and a complementary control terminal. Capacitor 1234 has a first terminal connected to the second signal terminal of transmission gate 1232, and a second terminal connected to the reference terminal. Inverter 1236 has an input for receiving $D_{OSC}$[0], and an output connected to the complementary control terminal of transmission gate 1232. Switched capacitor 1240 includes a transmission gate 1242, a capacitor 1244, and an inverter 1246. Transmission gate 1242 has a first signal terminal connected to the output of tunable LC oscillator 1200, a second signal terminal, a true control terminal for receiving a least significant bit of the oscillator control signal labeled "$D_{OSC}$[n–1]", and a complementary control terminal. Capacitor 1244 has a first terminal connected to the second signal terminal of transmission gate 1242, and a second terminal connected to the reference terminal. Inverter 1246 has an input for receiving $D_{OSC}$[n–1], and an output connected to the complementary control terminal of transmission gate 1242.

Tunable LC oscillator 1200 oscillates at a frequency equal to $$\frac{1}{2\pi\sqrt{LC}}.$$

Tuning portion 1220 changes the capacitance of tunable LC oscillator 1200 within a certain range. The range is determined by the sizes of capacitors in tuning portion 1220 in comparison with the sizes of capacitor 1214 and inductor 1212. Each leg of tuning portion 1220 can have a corresponding capacitor that is binary-weighted, equally sized, or some combination thereof. However DSP 1130 will need to encode $D_{OSC}$ according to the weighting of the capacitors The above-disclosed subject matter is to be considered illustrative, and not restrictive, and the appended claims are intended to cover all such modifications, enhancements, and other embodiments that fall within the true scope of the claims. For example, the tunable LC oscillator can be implemented with various oscillator architectures. Moreover the tunable frequency synthesizer can be implemented using various known fractional-N PLL architectures. Also additional measured characteristics besides temperature can be used by the tunable frequency synthesizer to adjust the CLOCK_OUT frequency, and various additional circuits can be added to implement a practical integrated circuit with flexibility for various applications. While compensation processor 450 summed various factors to form the FREQUENCY CONTROL signal, in other embodiments it may multiply a value representing a carrier frequency based on an adjustment and modulated data. While tunable frequency synthesizer 320 was shown as being a PLL, in other embodiments it could take other forms such as a simple divider. Moreover in data transmission applications, a data modulator could be placed at the output of the PLL rather than being used to form the FREQUENCY CONTROL signal. Any or all of these inputs can be represented in control signals for the tunable LC oscillator and the tunable frequency synthesizer and the frequency generation function can be advantageously distributed between the two such as to avoid creating spurs or to allow the tunable LC oscillator to be implemented with a relatively small amount of integrated circuit area.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated clock generator comprising:
    a tunable LC oscillator having an input for receiving an oscillator control signal, and an output for providing an oscillator clock signal;
    a tunable frequency synthesizer having a clock input coupled to said output of said tunable LC oscillator, a control input for receiving a synthesizer control signal, and an output for providing a clock output signal; and
    a processor having an input for receiving a data input signal, a first output for providing said oscillator control signal, and a second output for providing said synthesizer control signal, wherein said processor provides said oscillator control signal and said synthesizer control signal such that said tunable frequency synthesizer generates said output clock signal at a frequency indicated by said data input signal, and provides said synthesizer control signal further in response to a dynamic condition,
    wherein if a setting of said tunable LC oscillator creates a spur, said processor adjusts both said oscillator control signal and said synthesizer control signal such that said tunable frequency synthesizer generates said output clock signal at said frequency indicated by said data input signal.

2. The integrated clock generator of claim 1, wherein said dynamic condition comprises a temperature of said tunable LC oscillator.

3. The integrated clock generator of claim 1, wherein said dynamic condition comprises a value of a time-varying modulated data signal.

4. The integrated clock generator of claim 1, wherein said processor further provides said oscillator control signal in response to a static condition.

5. The integrated clock generator of claim 1 wherein said tunable LC oscillator comprises:
    an LC oscillator having an output for providing said oscillator clock signal; and
    a tuning portion coupled to said LC oscillator for selectively adding a reactance to said LC oscillator in response to said oscillator control signal.

6. The integrated clock generator of claim 5 wherein said tuning portion comprises a plurality of switched capacitors.

7. The integrated clock generator of claim 1, wherein said processor comprises:
    a modulator having an input for receiving a data signal, and an output for providing a modulated data signal,
    wherein said processor generates said oscillator control signal and said synthesizer control signal further in response to said modulated data signal.

8. The integrated clock generator of claim 1, wherein said tunable frequency synthesizer comprises a fractional-N PLL frequency synthesizer.

9. The integrated clock generator of claim 1, wherein said tunable LC oscillator comprises:
    an LC oscillator having an output; and
    an amplitude control loop coupled to said LC oscillator for adjusting an amplitude of a signal at said output of said LC oscillator.

10. An integrated circuit comprising:
    a tunable LC oscillator having an input for receiving an oscillator control signal, and an output for providing an oscillator clock signal;
    a tunable frequency synthesizer having a clock input coupled to said output of said tunable LC oscillator, a control input for receiving a synthesizer control signal, and an output for providing a clock output signal; and a processor having an input for receiving a data input signal, a first output for providing said oscillator control signal, and a second output for providing said synthesizer control signal, wherein said processor provides said oscillator control signal and said synthesizer control signal such that said tunable frequency synthesizer generates said output clock signal at a frequency indicated by said data input signal, and provides said synthesizer control signal further in response to a dynamic condition, wherein if a setting of said tunable LC oscillator creates a spur, said processor adjusts both said oscillator control signal and said synthesizer control signal such that said tunable frequency synthesizer generates said output clock signal at said frequency indicated by said data input signal; and a functional circuit having an input for receiving said clock output signal.

11. The integrated circuit of claim 10, wherein said dynamic condition comprises a temperature of said tunable LC oscillator.

12. The integrated circuit of claim 11, further comprising:
a temperature sensor thermally coupled to said tunable LC oscillator for providing a temperature signal representative of said temperature of said tunable LC oscillator.

13. The integrated circuit of claim 10, wherein:
said data input signal includes a frequency offset signal corresponding to an offset in frequency between said oscillator clock signal and a reference clock signal.

14. The integrated circuit of claim 13, further comprising:
a calibration circuit coupled to said processor for providing a frequency offset signal corresponding to an offset in frequency between said oscillator clock signal and a reference clock signal, wherein said processor generates said oscillator control signal and said synthesizer control signal further in response to said frequency offset signal.

15. The integrated circuit of claim 14, wherein said calibration circuit comprises:
a non-volatile memory coupled to said tunable frequency synthesizer for storing said frequency offset signal and providing said frequency offset signal so stored to said tunable frequency synthesizer; and
a calibration controller coupled to said tunable frequency synthesizer, for forming said frequency offset signal and storing said frequency offset signal so formed in said non-volatile memory.

16. The integrated circuit of claim 15, wherein said calibration circuit further comprises:
an integrated circuit terminal adapted to received said reference clock signal.

17. The integrated circuit of claim 10 wherein said tunable LC oscillator comprises:
an LC oscillator having an output for providing said oscillator clock signal; and
a tuning portion coupled to said LC oscillator for selectively adding a reactance to said LC oscillator in response to said oscillator control signal.

18. The integrated circuit of claim 17 wherein said tuning portion comprises a plurality of switched capacitors.

19. The integrated circuit of claim 10, wherein said tunable LC oscillator comprises:

an LC oscillator having an output; and
a divider having an input coupled to said output of said LC oscillator, and an output for providing said oscillator clock signal.

20. The integrated circuit of claim 10, wherein said tunable LC oscillator comprises:
an LC oscillator having an output; and
an amplitude control loop coupled to said LC oscillator for adjusting an amplitude of a signal at said output of said LC oscillator.

21. The integrated circuit of claim 10, further comprising:
a second oscillator having an output; and
a multiplexer having a first input coupled to said output of said second oscillator, a second input coupled to said output of said tunable LC oscillator, a control input for receiving a reference select signal, and an output coupled to said first input of said tunable frequency synthesizer.

22. A method comprising:
setting a frequency of a tunable LC oscillator in response to an oscillator control signal;
providing an oscillator clock signal as an output of said tunable LC oscillator;
synthesizing a clock output signal in response to said oscillator clock signal and a synthesizer control signal; and
forming said oscillator control signal and said synthesizer control signal in response to a data input signal;
changing both said oscillator control signal and said synthesizer control signal if said setting creates a spur; and
forming said synthesizer control signal further in response to a dynamic condition.

23. The method of claim 22 wherein said forming said synthesizer control signal further in response to said dynamic condition comprises:
forming said synthesizer control signal further in response to a temperature signal representative of a temperature of said tunable LC oscillator.

24. The method of claim 22 wherein said forming said synthesizer control signal further in response to said dynamic condition comprises:
forming said synthesizer control signal further in response to a time-varying modulated data signal.

25. The method of claim 24 wherein said forming said synthesizer control signal further in response to said time-varying modulated data signal comprises:
modulating a data signal to provide said modulated data signal.

26. The method of claim 22 further comprising:
forming said oscillator control signal further in response to a frequency offset signal corresponding to an offset in frequency between said oscillator clock signal and a reference clock signal.

27. The method of claim 26 wherein forming said oscillator control signal further in response to said frequency offset signal comprises:
calibrating said clock output signal using a reference clock signal; and
forming said frequency offset signal in response to said calibrating.

28. The method of claim 22 further comprising:
determining whether said setting creates said spur based on frequencies of harmonics of at least one signal associated with said synthesizing.

* * * * *